(12) United States Patent
Hohe et al.

(10) Patent No.: US 6,727,563 B1
(45) Date of Patent: Apr. 27, 2004

(54) OFFSET-REDUCED HALL ELEMENT

(75) Inventors: Hans-Peter Hohe, Heiligenstadt (DE); Josef Sauerer, Herzogenaurach (DE)

(73) Assignee: Fraunhofer-Gesellschaft zur Fürderung der angewandten Forschung e.V., Munich (DE)

(*) Notice: Subject to any disclaimer, the term of this patent is extended or adjusted under 35 U.S.C. 154(b) by 0 days.

(21) Appl. No.: 10/129,039
(22) PCT Filed: Aug. 18, 2000
(86) PCT No.: PCT/EP00/08091
§ 371 (c)(1), (2), (4) Date: Apr. 30, 2002
(87) PCT Pub. No.: WO01/35113
PCT Pub. Date: May 17, 2001

(30) Foreign Application Priority Data

Nov. 11, 1999 (DE) .......................... 199 54 360

(51) Int. Cl.⁷ ..................... H01L 29/82; H01L 43/00
(52) U.S. Cl. ............................... 257/427; 257/426
(58) Field of Search ............... 257/421, 422, 257/425, 427

(56) References Cited

U.S. PATENT DOCUMENTS 2,855,549 A * 10/1958 Kuhrt et al. ............ 257/426
3,293,586 A   12/1966 Cohen

FOREIGN PATENT DOCUMENTS

| DE | 1019745 A | 11/1957 | |
|---|---|---|---|
| DE | 1089047 A | 9/1960 | |
| DE | 14 90 587 A | 8/1969 | |
| EP | 269 510 A | 6/1988 | |
| GB | 786299 A | * 11/1957 | ............... 257/421 |
| GB | 860 200 A | 2/1961 | |
| JP | 52-12589 | 4/1991 | |

* cited by examiner

Primary Examiner—Long Pham
(74) Attorney, Agent, or Firm—Dougherty, Clements & Hofer

(57) ABSTRACT

A Hall element comprises a region having a non-zero Hall constant, a first contact for supplying an operating current to the region, a third contact for conducting the operating current from the region, the first and third contacts defining a direction of the operating current within the region, a second and a fourth contact for tapping a Hall voltage, and a conductor pattern connected to the first contact or to the third contact and substantially surrounding the region laterally or being arranged above or below the region. The conductor pattern has the effect that the intrinsic field of the operating current through the Hall element is suppressed outside the Hall element such that the Hall element effects an at least reduced offset in adjacent Hall elements. In addition thereto, the arrangement of the conductor pattern has the effect that effects of the current return on the Hall voltage generated by the Hall element itself are also at least reduced. An offset reduction is possible simultaneously on an element, by way of suitable implementation, also for both operating current directions in a spinning-current operating mode.

12 Claims, 3 Drawing Sheets

OFFSET-REDUCED HALL ELEMENT

FIELD OF THE INVENTION

The present invention relates to Hall elements, and in particular to Hall elements with offset compensation.

BACKGROUND OF THE INVENTION AND PRIOR ART

Hall elements make use of the Hall effect, for example, for measuring a magnetic field. The Hall effect is understood to be the occurrence of an electric field perpendicular to the current density vector j as a result of the effect of a magnetic field. The perpendicular electric field E is calculated by the following equation:

$$E = -R(j \times B).$$

In this equation, R is the Hall constant. For impurity semiconductors, the Hall constant is proportional to the difference between the mobility of the holes in the semiconductor and the mobility of the electrons in the semiconductor.

Materials having Hall constants that are sufficiently high to be used as substrate or sensor region or simply as a region for a Hall element, are for example intrinsic-conduction InSb, In(AsP), InAs or lightly p- or n-doped regions on silicon. Two contacts are used to conduct an operating current through the region.

In contrast thereto, the two other contacts are used for tapping the Hall voltage formed due to the Lorentz force which leads to deflection of the moving charge carriers due to a magnetic field acting on the Hall element. After a short period of time, there is created an electric field in the Hall element that is directed perpendicularly to the operating current and has such an intensity that the Lorentz force acting on the charge carriers of the operating current is compensated.

The Hall effect or a Hall element, in addition to measuring a magnetic field in accordance with magnitude and sign thereof, may also be utilized for multiplication of two electric quantities, i.e. the magnetic field and the control current, or for contactless signal generators. An additional possibility consists in arranging a Hall element in the vicinity of a conductor track and to measure, in non-contacting manner, the current in this conductor track by detection of the magnetic field generated by the current through said conductor track.

FIG. 5 illustrates a planar Hall element 100, comprising a region 100 formed of a material having a sufficiently high Hall constant. It is to be pointed out that, in the sense of the present description, the region of the Hall element having a non-zero Hall constant may either be a Hall substrate itself, which could be applicable for larger Hall elements, while however the region may also be a portion or region of an integrated circuit which in known manner is embedded in the IC substrate, e.g. in a well, or which has been modified by specific technological steps in order to have a corresponding Hall constant.

The region illustrated in FIG. 5 is of cruciform shape, which affords the advantage that the Hall element shown in FIG. 5 is also suited for so-called spinning current operation, i.e. that the operating current I can be passed through region 100 via contacts K1 and K3, while however in a different mode of operation, the operating current I may also be passed through the region via contacts K2 and K4, with the Hall voltage, of course, being present then at contacts K1 and K3 such that the same can be tapped at terminals A1 and A3. For the following considerations, however, and without restriction to the general nature, it will be assumed for reasons of convenience that the operating current I is applied via terminals A1 and A3, i.e. is fed to and removed from the region via the contacts K1 and K3, while the Hall voltage is given by a potential difference between the contacts K2 and K4, i.e. can be tapped at the terminals A2 and A4.

In addition to a region 100 with a non-zero Hall constant and the contacts K1, K2, K3 and K4 for contacting the region 100, a Hall element of course needs also leads 110, 120, 130 and 140 for electrically connecting the corresponding contacts K1 to K4 to the corresponding terminals A1 to A4. In case of the known Hall element shown in FIG. 5, the leads 110 to 140 are designed in accordance with the practical circumstances. Practical circumstances consist in particular in that there is, for example, the requirement that all terminals A1 to A4 should be arranged closely together in order to be passed, for example, to a central switching unit for spinning current operation. In that case, it is necessary, as shown in FIG. 5, to pass at least one lead, namely lead 130, around the Hall region 100. In other words, lead 130 comprises a first section 130a corresponding to the direction of the current I, a second section 130b perpendicular thereto, as well as a section 130c directed parallel to current I, but having the current flowing therethrough in the direction opposite to the operating current I.

As has already been pointed out, Hall elements serve for measuring an external magnetic field acting on the Hall region. For carrying out such a magnetic field measurement, however, an operating current must be sent through the region so that a Lorentz force can act at all on moving charge carriers. Of course, this operating current I, like any current, also has a magnetic field which also leads to local Hall voltages in the region. However, as the effects of this local intrinsic field are symmetric with respect to the central axis of the current in the element proper, there is no Hall voltage created on the outside of the element, i.e. at the contacts K2 and K4, that could be tapped via the terminals A2 and A4. This local intrinsic field of the operating current I in the Hall region, however, acts in its full magnitude on neighboring Hall elements if arrays of Hall elements are used, as is the case in spinning current operation with mechanical pre-compensation. The intrinsic magnetic field of a Hall element in an array of Hall elements, due to its magnetic field generated and penetrating the neighboring element, leads to a measurement signal there that makes itself felt as an offset. The magnetic field generated by the operating current thus is superimposed on the external magnetic field to be measured in the first place. Thus, there is always an offset problem caused by the magnetic intrinsic field of the active sensor region when there are several sensors provided in the immediate vicinity, since the intrinsic fields of the sensors have the effect of an external magnetic field on the respective other sensors.

An additional problem in the known arrangement shown in FIG. 5 arises due to the terminal leads 110 to 140 which any Hall element needs to have. For connecting the terminals A1 to A4 of the Hall element to a driving control, it is as a rule necessary, as already pointed out hereinbefore, to pass at least one of the current-carrying leads, in the example of FIG. 5 lead 130, around the region 100. In the typical example of the prior art, as shown in FIG. 5, the unfavorable lead from terminal A3 to contact K3 consists of the differently aligned partial lengths 130a to 130c.

Leads 130a to 130c deliver the following magnetic fields. The magnetic field generated by the operating current flowing through element 130a still is symmetric with the current flow in the active part of the Hall region and therefore generates in region 100 no Hall voltage that is externally measurable. However, this does no longer apply to the two partial lengths 130b and 130c. The magnetic field generated in these conductors acts on the region in its full magnitude and is measured by said region as well, i.e. itself produces a Hall voltage between the terminals A2 and A4. Due to the fact that this additional field is always present when the element is in operation, it appears to the outside like a fixed offset which the element has. Only by changing the operating current is it possible to distinguish this share from a real offset, in that a normal offset changes linearly with the operating current, whereas the offset caused by the operating current due to interference fields changes in square fashion with the operating current.

The document DE 1 019 745 A discloses a magnetic-field dependent resistor assembly and in particular a Hall generator in which a resistor body is of parallelepiped shape having on two opposite narrow sides contacts for supplying an operating current and for removing an operating current, respectively. Each electrode has connected thereto a lead wire extending laterally around the resistor body. In the middle of two other sides of the parallelepiped shape, there are arranged the tapping locations for the Hall voltage, which have lead wires connected thereto. The lead wires are twisted with each other.

U.S. Pat. No. 3,293,586 discloses a Hall plate element comprising a semiconducting material displaying the Hall effect and applied on a layer of mechanically protective, insulating material. Contacts for supplying an operating current are formed by depositing a conductive material in electric contact with the semiconducting material. Furthermore, contacts for tapping the Hall voltage at the semiconducting material are provided by establishing ohmic contact with the semiconducting material. The ohmic contacts have conductive strips connected thereto that extend beyond the semiconducting material, so that contact wires may be soldered thereto.

SUMMARY OF THE INVENTION

It is the object of the present invention to provide a Hall element of reduced offset.

In accordance with a first object of the present invention, this object is achieved by a Hall element comprising a region having a non-zero Hall constant; a first contact for supplying an operating current to the region; a third contact for conducting the operating current away from the region, the first and third contacts defining a direction of the operating current within the region; a second and a fourth contact for tapping a Hall voltage; and a conductor pattern connected to the first contact or to the third contact and substantially surrounding the region laterally , the conductor pattern comprising two partial conductors that are connected to the first or the third contact, that are connected to each other and extend, on respective opposite sides of the region, around the region in the direction of the contact to which they are connected, such that an operating current across the contact to which the two partial conductors are connected, can be divided into two operating current shares across the two partial conductors.

In accordance with a second object of the present invention, this object is achieved by a Hall element comprising a region having a non-zero Hall constant; a first contact and a third contact for supplying an operating current to the region and for conducting the operating current away from the region or, optionally, for tapping a Hall voltage; a second and a fourth contact for tapping a Hall voltage or, optionally, for supplying an operating current to the region and conducting the same away from the region; wherein two conductive areas are provided which are both arranged above the region or below the region or are arranged with respect to the region such that one conductive area is arranged above the region and the other conductive area is arranged below the region, wherein the first conductive area is connected to the region in electrically conductive manner in order to form the first contact, with the first conductive area in a contact region of the first contact being moreover electrically isolated from a remainder of the first conductive area; wherein the second conductive area is connected to the region in electrically conductive manner in order to form the third contact, with the first conductive area being not present in a contact region of the third contact, so that the first contact is electrically isolated from the third contact except for the region; wherein the first conductive area is connected to the region in order to form the second contact, with the second conductive area being not present in a contact region of the second contact; and wherein the second conductive area is connected to the region in order to form the fourth contact, with the second conductive area, in a contact region of the fourth contact, being moreover electrically isolated from a remainder of the second conductive area.

The present invention is based on the finding that one has to depart from the opinion valid so far, namely to design the leads merely in accordance with the practical circumstances, but without taking into consideration the operation of the Hall element and the effects thereof on the environment, respectively, in order to provide an offset-reduced Hall element having on the one hand a reduced offset due to its own operating current and having on the other hand also lesser effects on adjacent Hall elements. Although there are presumably methods known in technology for calibrating such offset errors out, it is generally better at all times to not allow such errors to be generated at all, whereby more reliable and less complex and thus less expensive elements may be implemented.

Contrary to the prior art, in which the operating current leads are designed simply in accordance with the external practical circumstances, a Hall element according to the invention has a conductor structure or pattern that is connected to the first or third contact and substantially surrounds the region laterally or is arranged above or below the region. Such a conductor pattern has the effect that the magnetic fields of the current through the Hall element and of a current in the conductor pattern for returning the operating current cancel each other out at least in part in a region outside of the Hall element, i.e. where other Hall elements may be placed, while the magnetic field of the current in the leads at the same time acts on the region as well as symmetrically as possible, so that the magnetic field generated by the current in the conductor pattern, itself does not lead to a Hall voltage in the element. Thus, according to the invention, the intrinsic magnetic field of a Hall element is shielded at least in part from other Hall elements by simple measures, and the additional effect achieved is that the magnetic field of the leads acts at least somewhat symmetrically on the Hall element itself, so that the operating current does not result in a Hall voltage at the element itself.

In a first embodiment of the present invention, the conductor pattern is in the form of a sheet-like metallization above the region so that, analogous with two adjacent flat conductors with different directions of current flow in the interior thereof, i.e. between the region and the metallization plane, an in theory twice as large magnetic field is present tangentially to the surface of the region, whereas the fields perpendicular to the surface as well as all fields outside of the arrangement of region and metallization area are substantially zero or greatly reduced.

Due to the fact that the Hall region can only detect fields extending perpendicularly to the surface, this leads to a considerable reduction of the electric field in the element caused by the intrinsic field.

This metallization area may be arranged either above or below the region, and may have a geometric shape corresponding to that of the region, which provides for high offset freedom, or a shape not corresponding to the geometric shape of the region which, though resulting in reduced offset freedom, already leads to distinct improvements as compared to the prior art.

In accordance with an additional embodiment of the present invention, the conductor pattern for return comprises a first section and a second section which branch in the vicinity of the third contact and are passed around the region preferably symmetrically so as to substantially surround the region. Here too, a shift of the magnetic field in the surroundings of the Hall region takes place so that the magnetic field in the surroundings of the Hall region becomes symmetric to the same and thus does not lead to a Hall voltage. Outside of the return, i.e. in areas where other Hall elements may be placed, there is in contrast thereto just a greatly reduced magnetic field present. This embodiment can be realized more easily in terms of circuit technology since there are no different metallization planes necessary. However, as compared to a second metallization plane as conductor pattern, it has the disadvantage that the offset freedom is not quite as complete.

It may thus be summarized that the conductor pattern according to the invention, due to the fact that it substantially surrounds the region laterally or is arranged above or below the region, at the same time reduces both the interfering influence of the return line on the region as well as the intrinsic field acting on other Hall elements that are arranged in the vicinity.

BRIEF DESCRIPTION OF THE DRAWINGS

Preferred embodiments of the invention will be described in detail hereinafter with reference to the drawings in which.

DETAILED DESCRIPTION OF PREFERRED EMBODIMENTS

Figure 1A:
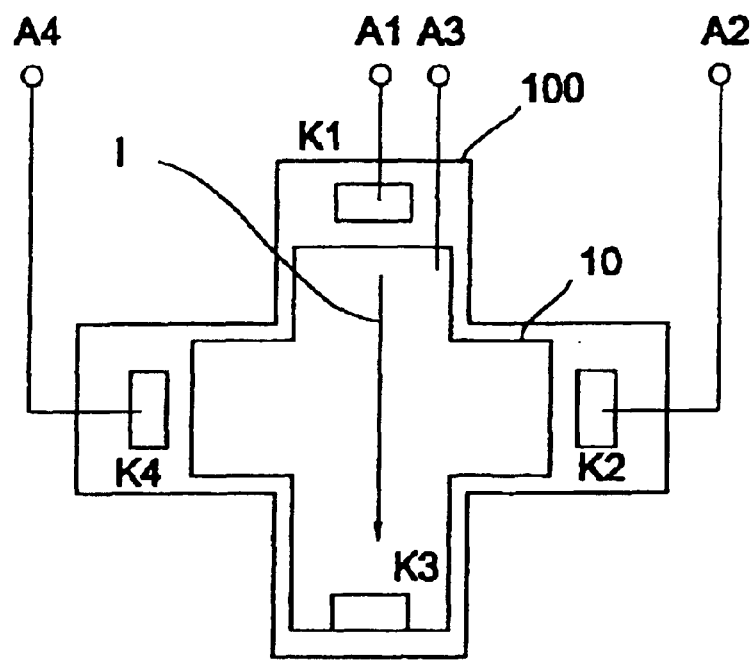
FIG. 1A shows a Hall element according to a first embodiment of the present invention.
Figure 5:
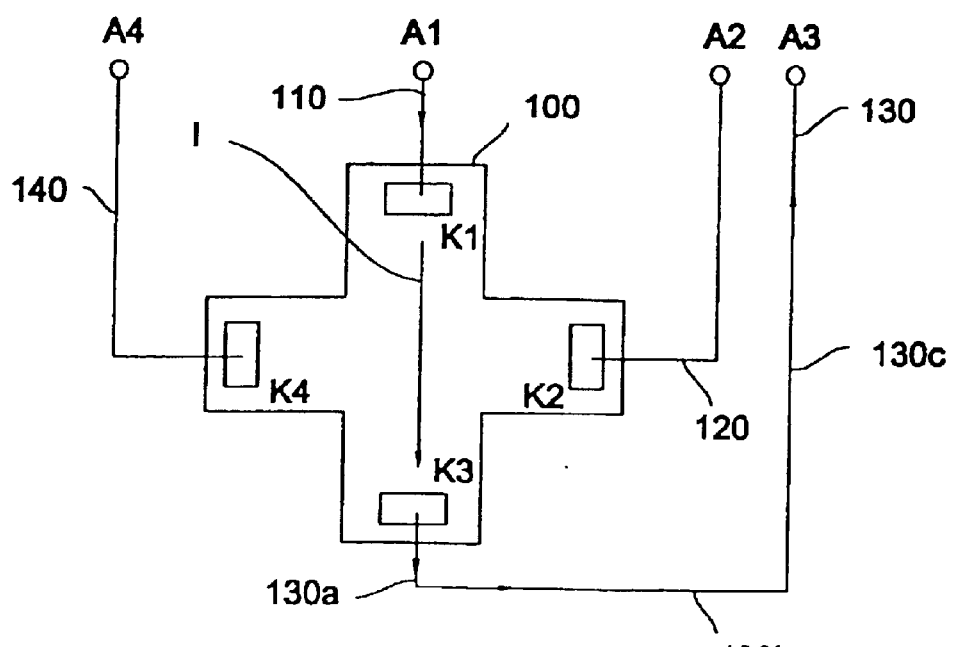
FIG. 5 shows a known Hall element.

FIG. 1A shows a Hall element according to a first preferred embodiment of the present invention. The Hall element comprises, just as the Hall element shown in FIG. 5, a region 100 having a non-zero Hall constant, four contacts K1, K2, K3 and K4 as well as four terminals A1 to A4 each connected to their respective contacts, as shown in FIG. 1A. In contrast to the known Hall element shown in FIG. 5, the Hall element shown in FIG. 1A comprises as conductor structure or pattern a metallization 10, which in the embodiment illustrated in FIG. 1A is arranged above region 100. However, it is to be pointed out that the metallization 10 could also be arranged below the region, yielding the same effect.

The leads from terminals A2 and A4 to contacts K2 and K4, in static operation, may be chosen in the usual manner as they are unproblematic with respect to magnetic fields as they are almost no currents flowing therein if the Hall voltage is measured in non-contacting manner.

However, in the event of a mode of operation corresponding to "spinning current", the contacts K2 and K4 must be designed in accordance with the contacts K1 and K3 as well. This means a further metallization plane above the Hall region which, for example, returns the contact K4 to the location of the contact K2 in accordance with the contact K3 above the region.

In the embodiment of the present invention shown in FIG. 1A, the geometric shape of the conductor pattern 10 is substantially equal to the geometric shape of the region 100, except for the fact that the contacts K1, K2 and K4 are not covered, such that the leads from terminals A1, A2 and A4 can be terminated here without a problem. However, if a suitable technology is employed, the conductor pattern may also extend completely over the region 100 or be larger than the region, however, with the best compensation results being achieved when the conductor pattern 10 also is symmetric with respect to the axis of symmetry of the region.

Figure 1B:
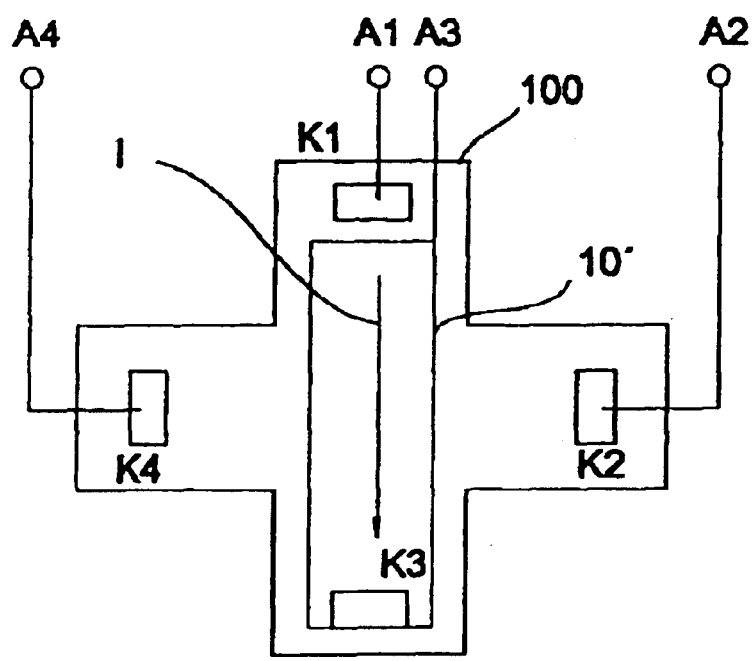
FIG. 1B shows a Hall element according to a second embodiment of the present invention.

FIG. 1B shows a conductor pattern of reduced surface area, which is in the form of a strip 10' only and results in not as complete offset compensation as in case of the conductor pattern 10 of FIG. 1A, but which already provides for considerable improvements as compared to the prior art. The best offset reduction results are achieved again if the conductor pattern 10' is arranged symmetrically with respect to the axis of symmetry of region 100; if region 100, as in case of FIGS. 1A and 1B illustrating a cruciform region, has two axes of symmetry, the conductor pattern should be symmetric with respect to the axis of symmetry along which the operating current I flows through region 100.

Figure 2:
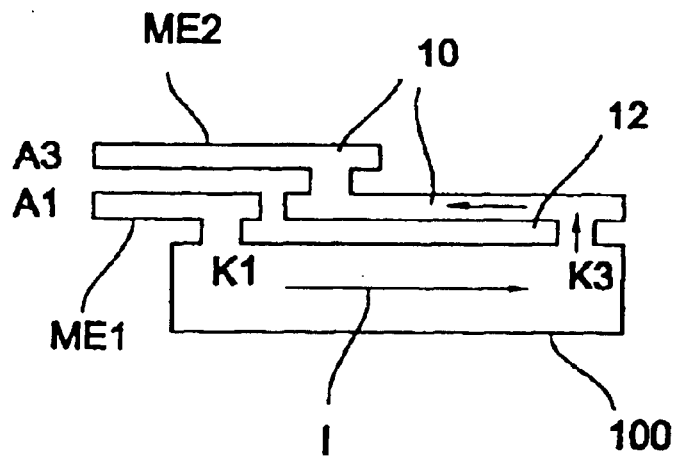
FIG. 2 shows a cross-sectional view of a Hall element shown in FIG. 1A or FIG. 1B.

FIG. 2 shows a longitudinal sectional view of the Hall element illustrated in FIGS. 1A and 1B, respectively. It is assumed that the operating current is introduced into the region 100 via terminal A1 and the lead from terminal A1 to contact K1 and flows along the arrow marked I to the contact K3 and there flows a short distance upwardly and then reverses its direction and flows back to terminal A3 in a direction opposite to the operating current I in region 100.

As regards the current path outside of the region, it is to be pointed out that it is sensible here too, for reducing the effects on neighboring Hall elements, that the lead-in and lead-out of the operating current continue in two different planes on top of each other. This is possible in case of many manufacturing technologies by two metallization planes ME1 and ME2, as outlined in FIG. 2. As an alternative, the leads may also extend immediately adjacent each other or even in intertwined fashion in order to obtain the effect that the magnetic fields of the two conductors are greatly reduced, except in the region between the conductors. As regards the space between region 100 and the metallization structure 10, there may be used any dielectric 12, which typically will be predetermined by the technology used.

It is to be pointed out that, due to the anti-parallel current conduction in region 100 on the one hand and in the conductor pattern 10 on the other hand, the effect occurs that a relatively strong magnetic field appears in dielectric 12, whereas a greatly reduced magnetic field is present in the area outside the conductor pattern, i.e. above conductor pattern 10 and below region 100, respectively, since the two magnetic fields cancel each other out there. The very strong magnetic field present in dielectric 12, however, due to the direction provided (tangentially with respect to the surface), does not have the effect of a Hall voltage, so that there is thus no Hall voltage appearing between contacts K2 and K4. It is to be pointed out that properties of complete symmetry of the conductor pattern 10 are indeed desirable, but possibly cannot be realized at all times. The compensation effect, however, does not decrease suddenly, but slowly so that certain asymmetries due to external conditions may be acceptable since there is still a considerable part of magnetic field cancellation taking place in the outer region.

It is obvious that the conductor pattern 10 may also be provided underneath the region 100 and that the effects achievable thereby are substantially the same as if the return current were passed above the region, i.e. if the conductor pattern 10 is provided above region 100.

Figure 3:
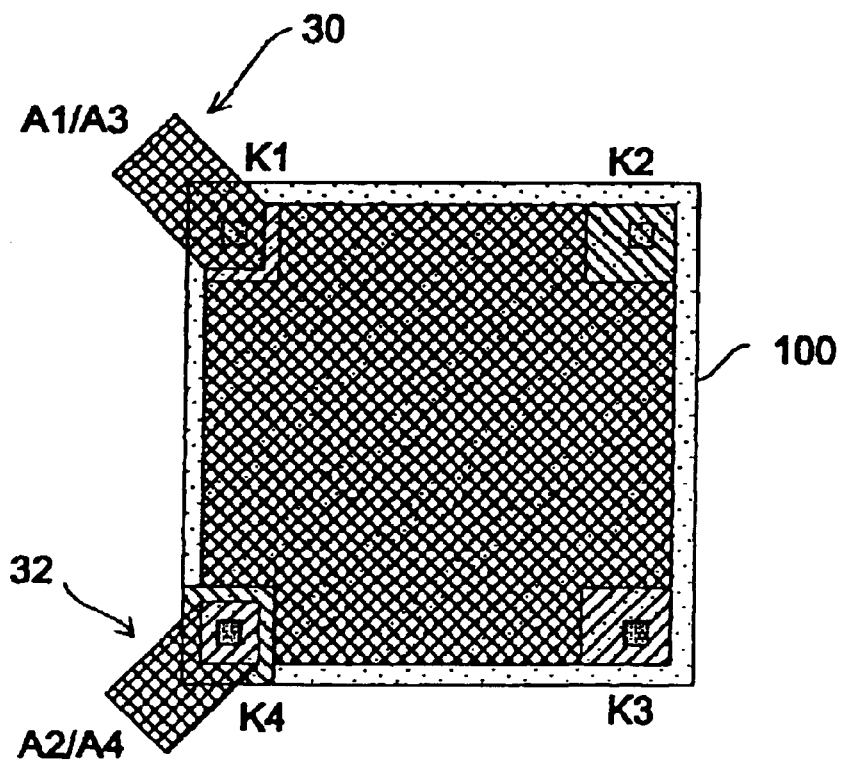
FIG. 3 shows a Hall element according to a further embodiment of the present invention.

In the following, reference will be made to FIG. 3 illustrating a Hall element according to the invention comprising two metallization planes, with the return line shown for contacts K1 and K3 in FIGS. 1A, 1B and 2 being realized in analogous manner for the contacts K2 and K4 on the other metallization plane as well. Such an element then has terminal portions 30 and 32 on two sides only, and both terminal portions may be used either as lead-in and lead-out of the operating current (terminal portion 30 for terminals A1 and A3) or as Hall voltage tap (terminal portion 32 for terminals A2 and A4). In FIG. 3, the region 100 is of square configuration. Furthermore, there are a first metallization plane, shown in FIG. 3 in hatched form from the upper left to the lower right, as well as a second metallization plane, shown in FIG. 3 in hatched form from the lower left to the upper right. The two contacts K1 and K2 establish a connection between Hall region 100 and the first metallization plane, i.e. the metallization plane hatched from the upper left to the lower right, whereas the contacts K3 and K4 establish a connection between region 100 and the second metallization plane, i.e. the metallization plane hatched from the lower left to the upper right. The diamond-shaped hatching in the essential part of FIG. 3 and in terminal portions 30 and 32 is to point out schematically that both metallization planes, i.e. the first metallization plane and the second metallization plane, are provided on top of each other here, while being isolated from each other, of course.

The operating current is supplied to contact K1 via the first metallization plane and from there is supplied into region 100, where the operating current then flows to contact K3 and from there reaches the second metallization plane via contact K3, in order to flow back across the second metallization plane to terminal portion 30 where terminal A3 is now constituted by the upper metallization plane. It can be seen from FIG. 3 that the first metallization around contact region K1 is isolated from the first metallization plane arranged over the remaining area of region 100, and that also in the region of contact K3 the first metallization plane is not provided, so that there is no short-circuiting caused between first metallization plane and second metallization plane.

Terminal A2 is connected via the second metallization plane to contact K4 and via the contact K4 to region 100. The Hall element is connected furthermore to the first metallization plane via contact K2, so that the Hall voltage may be tapped via terminals A4 and A2 for the first and second metallization planes. It can be seen from FIG. 3, that in the region of contact K4, the second metallization plane is isolated from the sheet-like second metallization plane above. region 100, and that furthermore the first and second metallization planes are electrically isolated from each other at contact K4 in contact region 32 just as in contact region 30, so as to avoid short-circuiting there. It can be seen in addition that contact K2 is not connected to the first metallization plane, i.e. that the second metallization plane does not extend as far as the region of contact K2, so as to exclude short-circuiting here as well.

The embodiment illustrated in FIG. 3 has the advantage that there still are only two terminal portions present and that the operating current supply can take place not only via terminals A1 and A3, but just as well via terminals A2 and A4, which is advantageous when spinning current operation is desired.

Figure 4:
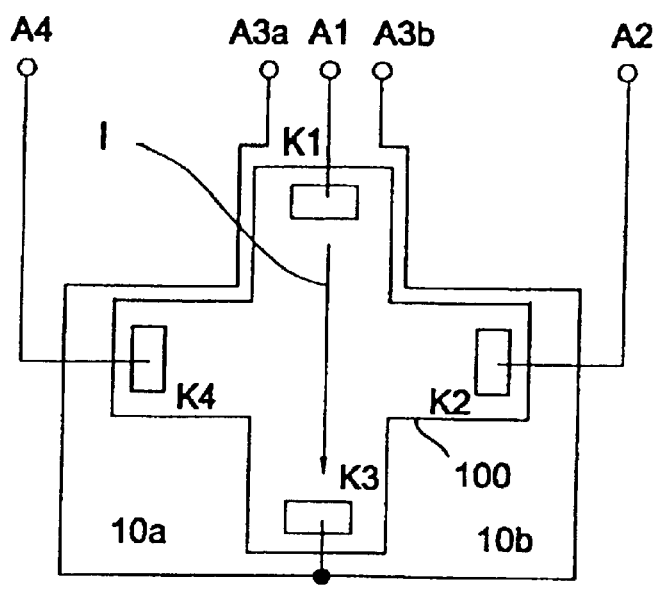
FIG. 4 shows a Hall element according to an additional embodiment of the present invention.

FIG. 4 illustrates an additional embodiment of the present invention in which the conductor pattern for returning the current is not arranged above or below region 100, but is designed so as to substantially surround the region. This is achieved by dividing the conductor pattern in the vicinity of contact K3 into two conductor portions 10*a* and 10*b* such that approximately half of the operating current I flows back in both conductor portions 10 *a* and 10*b*. Thus, there are formed two partial terminals A3*a* and A3*b* for the conductor pattern. These two terminals, shown separately in FIG. 4, may readily be shorted again, i.e. connected to each other, by the external wiring. Though the embodiment illustrated in FIG. 4 is not as efficient as the first embodiment, having a metallization area above or below, respectively, as regards its reducing effect on the magnetic fields located outside of the Hall element, the embodiment shown in FIG. 4 has the advantage that there are no two different metallization areas necessary. Thus, this option can also be used if just one plane can be utilized. For reducing as much as possible the effects of the operating current return through the conductor pattern 10*a*, 10*b* on the Hall voltage to be tapped at terminals A2 and A4, conductors 10*a* and 10*b* should possibly be of equal length so that the operating current is separated in like parts, since the ohmic resistance of the conductors 10*a* and 10*b* will then be the same. In addition thereto, the two elements 10*a* and 10*b* should be returned possibly symmetrically on both sides of region 100, however, with the exact return path being not of decisive significance. The effects of the operating current return on the Hall voltage at terminals A2 and A4 is best when the current is split into exactly equal halves in conductors 10*a* and 10*b* and when the conductors are as symmetric as possible with respect to the axis of symmetry of the region along which the operating current I flows. Deviations from symmetry, however, do not suddenly result in loss of compensation, but merely in a slowly increasing offset which, depending on the application, should still be tolerable, but which is already reduced considerably as compared to the case shown in FIG. 5, in which the return path does not extend around region 100.

We claim:

1. A Hall element comprising:

a Hall region having a non-zero Hall constant;

a first contact for supplying an operating current to the Hall region;

a third contact for conducting the operating current away from the Hall region, the first and third contacts defining a direction of the operating current within the Hall region; a second contact and a fourth contact for tapping a Hall voltage; and a conductor pattern connected to the first contact or to the third contact and substantially surrounding the region laterally, the conductor pattern comprising two partial conductors that are connected to each other at a connecting point, the connecting point being connected to the first contact or the third contact, wherein the two partial conductors extend, on respective opposite sides of the Hall region, around the Hall region in the direction of the contact to which they are connected, such that an operating current across the contact to which the two partial conductors are connected, is divided into two operating current shares across the two partial conductors.

2. A Hall element according to claim 1, wherein the two partial conductors are of equal length.

3. A Hall element according to claim 1, wherein the Hall region is symmetric with respect to an axis of symmetry, the first and third contacts being located on the axis of symmetry and the partial conductors being symmetric to each other with respect to the axis of symmetry.

4. A Hall element according to claim 1, wherein the partial conductors substantially follow the outer contour of the Hall region.

5. A Hall element according to claim 1, wherein the Hall region has a shape, wherein the shape is selected from the group consisting of a rectangular shape, a square shape or a cruciform shape.

6. A Hall element comprising:

a Hall region having a non-zero Hall constant;

a first contact and a third contact for supplying an operating current to the Hall region and for conducting the operating current away from the Hall region or, for tapping a Hall voltage; a second contact and a fourth contact for tapping a Hall voltage in case of the first contact and the third contact are for supplying the operating current or for supplying an operating current to the Hall region and conducting the same away from the Hall region in case of the first contact and the third contact are for tapping the Hall voltage;

wherein two distinct conductive areas are provided which are both arranged above the Hall region or below the Hall region or are arranged with respect to the Hall region such that one conductive area is arranged above the Hall region and the other conductive area is arranged below the Hall region, wherein the first conductive area is connected to the Hall region in electrically conductive manner in order to form the first contact, with the first conductive area in a contact region of the first contact being moreover electrically isolated from a remainder of the first conductive area;

wherein the second conductive area is connected to the Hall region in electrically conductive manner in order to form the third contact, with the first conductive area being not present in a contact region of the third contact, so that the first contact is electrically isolated from the third contact except for the Hall region;

wherein the first conductive area is connected to the Hall region in order to form the second contact, with the second conductive area being not present in a contact region of the second contact; and wherein the second conductive area is connected to the Hall region in order to form the fourth contact, with the second conductive area, in a contact region of the fourth contact, being moreover electrically isolated from a remainder of the second conductive area.

7. A Hall element according to claim 6, wherein a dielectric is arranged between the conductive area and the Hall region.

8. A Hall element according to claim 6, wherein a dielectric is provided between the first conductive area and the second conductive area.

9. A Hall element according to claim 6, wherein the first and second conductive areas are made of a material selected from the group consisting of metal or a semiconductor material.

10. A Hall element according to claim 6, wherein the geometric shape and expanse of the conductive areas corresponds to the geometric shape and expanse of the Hall region, respectively.

11. A Hall element according to claim 6, wherein the Hall region has an axis of symmetry on which the first and third contacts are arranged, and wherein the conductive area is symmetric and oriented in accordance with the axis of symmetry.

12. A Hall element according to claim 6, wherein the first contact is connected to a first terminal, wherein the second contact is connected to a second terminal, wherein the third contact is connected to a third terminal, wherein the fourth contact is connected to a fourth terminal, wherein the first and third terminals are arranged on top of each other, and wherein the second and fourth terminals are arranged on top of each other.

* * * * *

UNITED STATES PATENT AND TRADEMARK OFFICE
CERTIFICATE OF CORRECTION

PATENT NO. : 6,727,563 B1
DATED : April 27, 2004
INVENTOR(S) : Hans-Peter Hohe and Josef Sauerer It is certified that error appears in the above-identified patent and that said Letters Patent is hereby corrected as shown below:

Title page,
Item [73], Assignee, change "Fürderung der angewandten", to -- Förderung der angewandten --.

Signed and Sealed this

Twenty-second Day of February, 2005

JON W. DUDAS
*Director of the United States Patent and Trademark Office*